United States Patent
Chen et al.

(10) Patent No.: US 11,374,104 B2
(45) Date of Patent: Jun. 28, 2022

(54) METHODS OF REDUCING CAPACITANCE IN FIELD-EFFECT TRANSISTORS

(71) Applicant: Taiwan Semiconductor Manufacturing Co., Ltd., Hsin-Chu (TW)

(72) Inventors: Chun-Han Chen, Changhua County (TW); Chen-Ming Lee, Taoyuan County (TW); Fu-Kai Yang, Hsinchu (TW); Mei-Yun Wang, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 73 days.

(21) Appl. No.: 16/587,474

(22) Filed: Sep. 30, 2019

(65) Prior Publication Data

US 2021/0098594 A1    Apr. 1, 2021

(51) Int. Cl.
| H01L 29/51 | (2006.01) |
| H01L 29/78 | (2006.01) |
| H01L 21/3105 | (2006.01) |
| H01L 21/02 | (2006.01) |
| H01L 29/40 | (2006.01) |

(52) U.S. Cl.
CPC ...... *H01L 29/511* (2013.01); *H01L 21/02271* (2013.01); *H01L 21/31053* (2013.01); *H01L 29/401* (2013.01); *H01L 29/7851* (2013.01)

(58) Field of Classification Search
CPC ............. H01L 29/511; H01L 21/02271; H01L 21/31053; H01L 29/401; H01L 29/7851
See application file for complete search history.

(56) References Cited

U.S. PATENT DOCUMENTS

| 8,796,666 B1 | 8/2014 | Huang et al. |
| 8,815,712 B2 | 8/2014 | Wan et al. |
| 8,837,810 B2 | 9/2014 | Chen et al. |
| 8,963,258 B2 | 2/2015 | Yu et al. |
| 9,093,530 B2 | 7/2015 | Huang et al. |
| 9,134,633 B2 | 9/2015 | Lin et al. |
| 9,171,929 B2 | 10/2015 | Lee et al. |
| 9,214,555 B2 | 12/2015 | Oxland et al. |
| 9,230,867 B2 | 1/2016 | Cheng et al. |
| 9,236,267 B2 | 1/2016 | De et al. |
| 9,404,743 B2 | 8/2016 | Chiu et al. |
| 9,520,482 B1 | 12/2016 | Chang et al. |
| 9,547,741 B2 | 1/2017 | Schroeder et al. |
| 9,548,303 B2 | 1/2017 | Lee et al. |
| 9,576,814 B2 | 2/2017 | Wu et al. |
| 9,659,786 B2 | 5/2017 | Greene et al. |
| 9,823,585 B2 | 11/2017 | Shih et al. |
| 9,841,687 B2 | 12/2017 | Lee et al. |
| 10,276,554 B1 | 4/2019 | Ho et al. |
| 10,276,676 B1 | 4/2019 | Liang et al. |

(Continued)

*Primary Examiner* — Selim U Ahmed
*Assistant Examiner* — Evan G Clinton
(74) *Attorney, Agent, or Firm* — Haynes and Boone, LLP

(57) ABSTRACT

A semiconductor structure includes a fin protruding from a substrate, a first and a second metal gate stacks disposed over the fin, and a dielectric feature defining a sidewall of each of the first and the second metal gate stacks. Furthermore, the dielectric feature includes a two-layer structure, where sidewalls of the first layer are defined by the second layer, and where the first and the second layers have different compositions.

20 Claims, 14 Drawing Sheets

(56) References Cited

U.S. PATENT DOCUMENTS

| | | |
|---|---|---|
| 2013/0285116 A1 | 10/2013 | Lochtefeld et al. |
| 2016/0133632 A1 | 5/2016 | Park et al. |
| 2018/0261514 A1 | 9/2018 | Xie |
| 2018/0323277 A1 | 11/2018 | Zhou |
| 2020/0083222 A1* | 3/2020 | Kim .................. H01L 29/66545 |
| 2020/0152736 A1* | 5/2020 | Yu .................... H01L 21/823437 |
| 2020/0227323 A1* | 7/2020 | Zang .................. H01L 29/6653 |

* cited by examiner

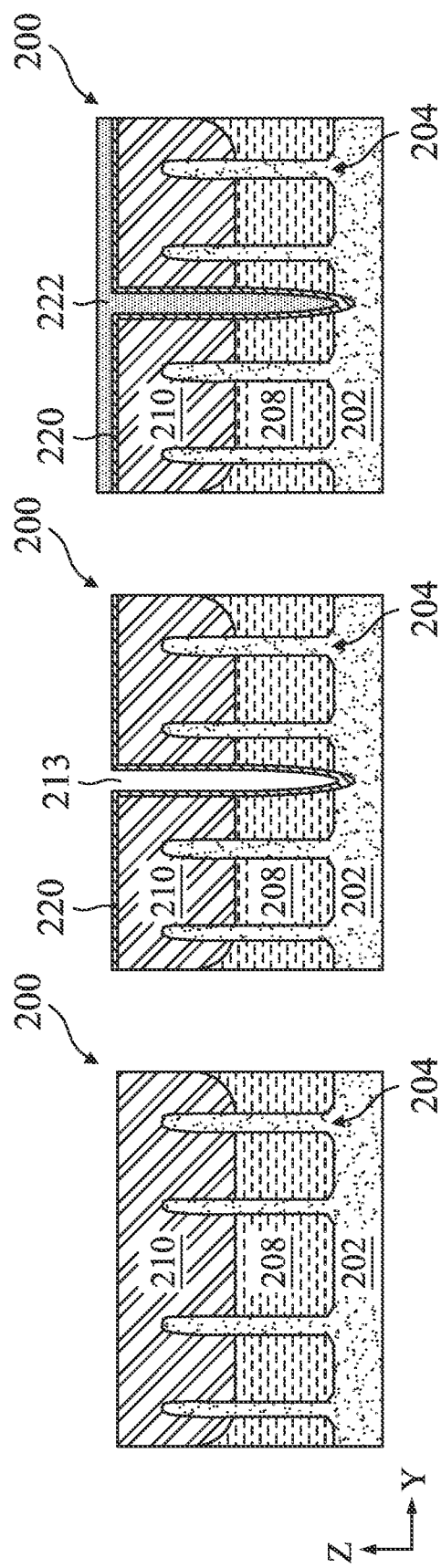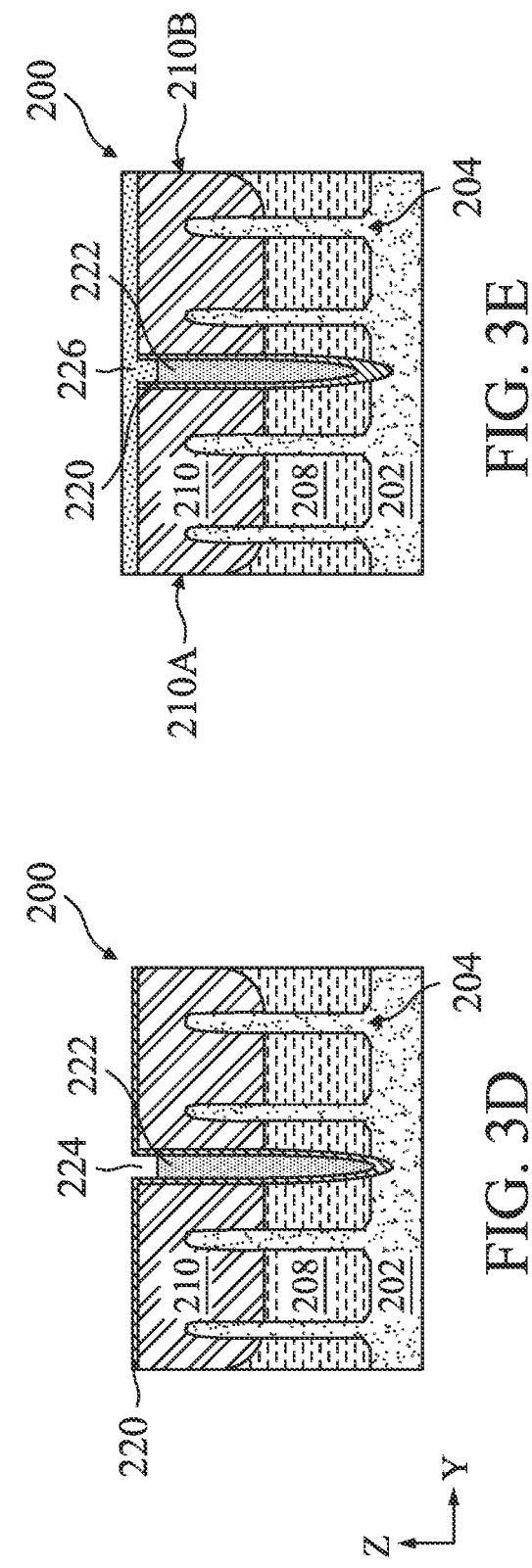

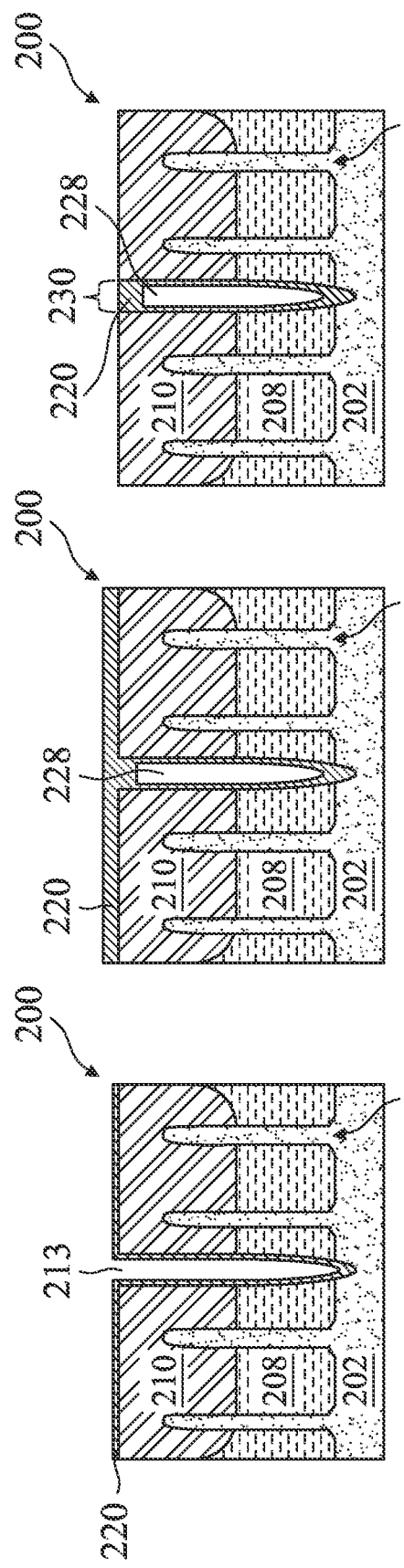
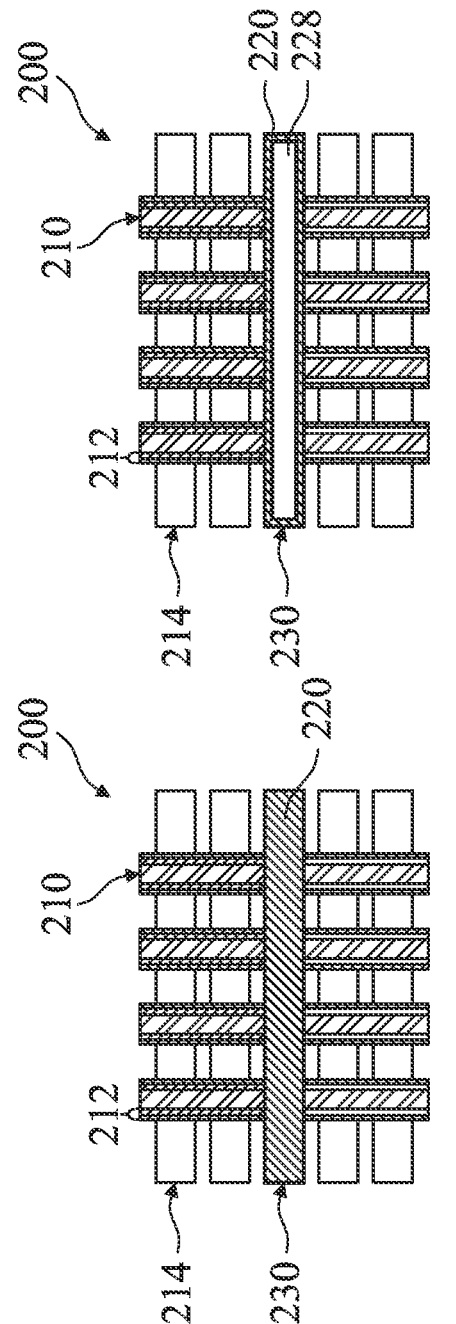
FIG. 4A  FIG. 4B  FIG. 4C  FIG. 4D  FIG. 4E

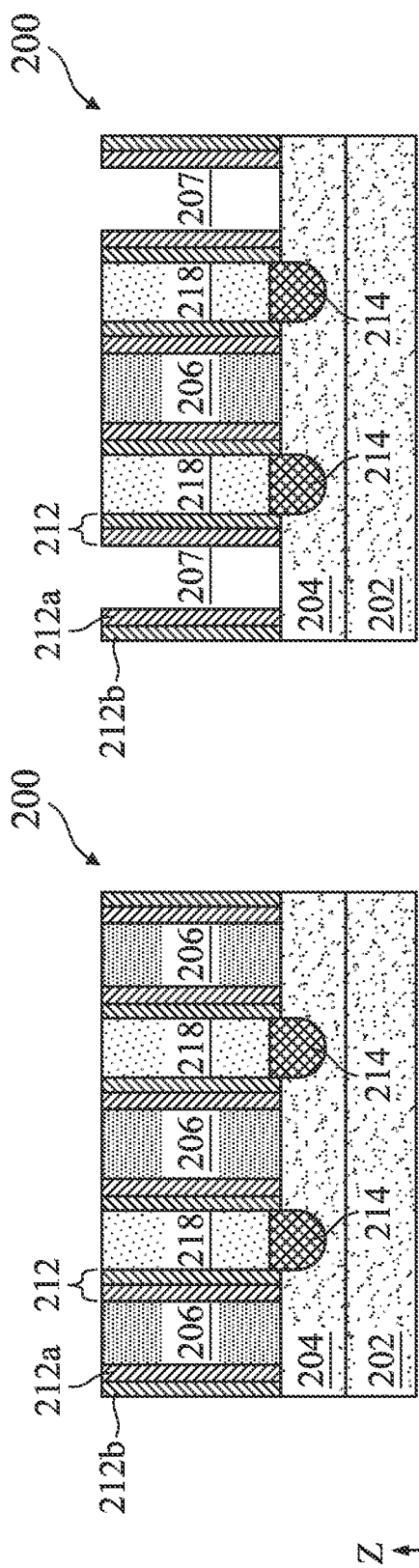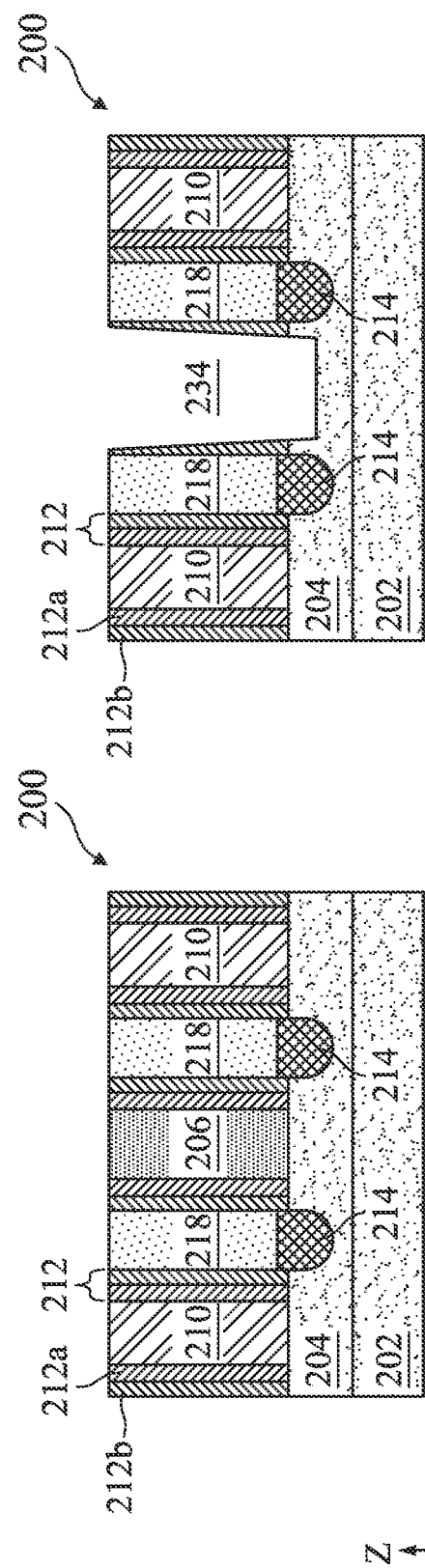

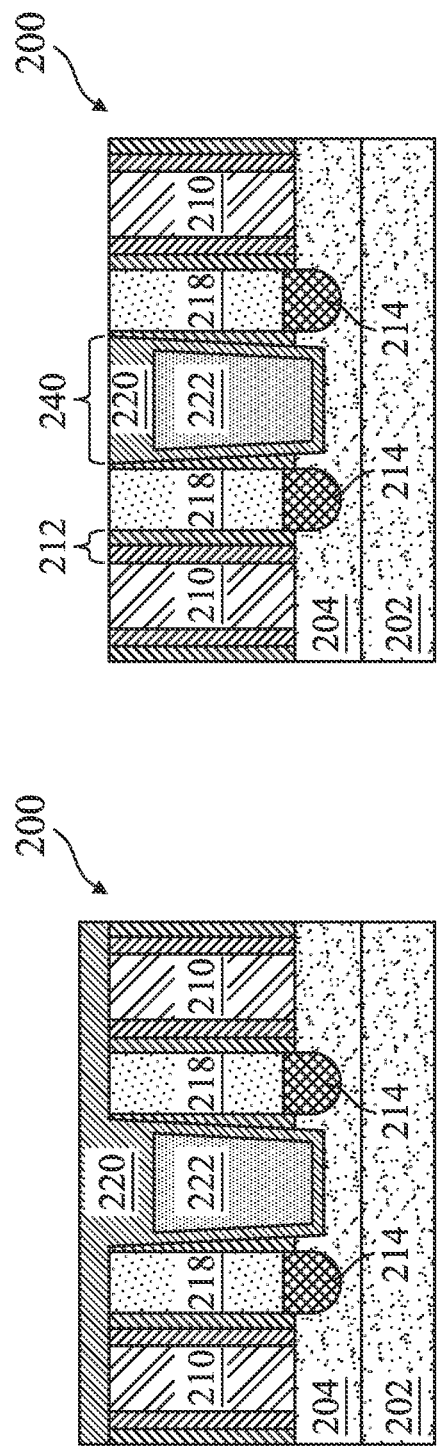
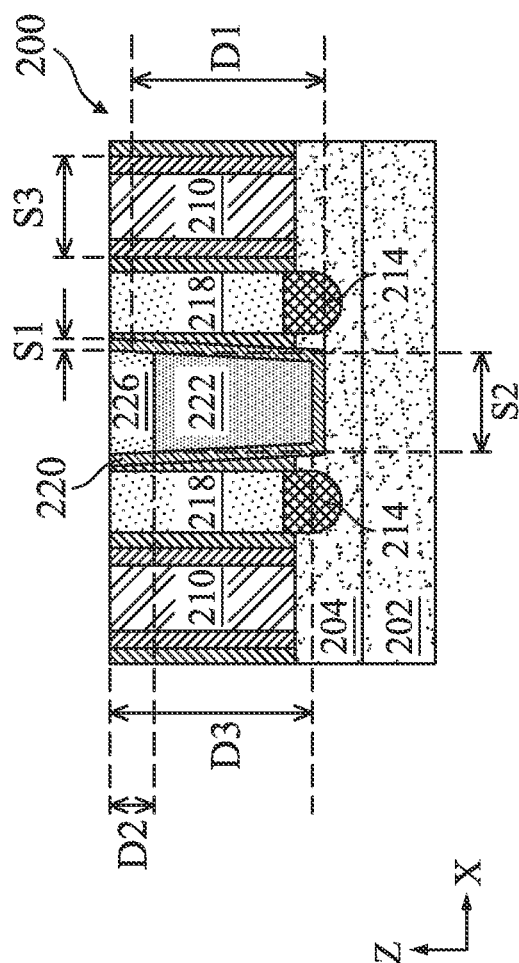
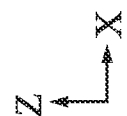

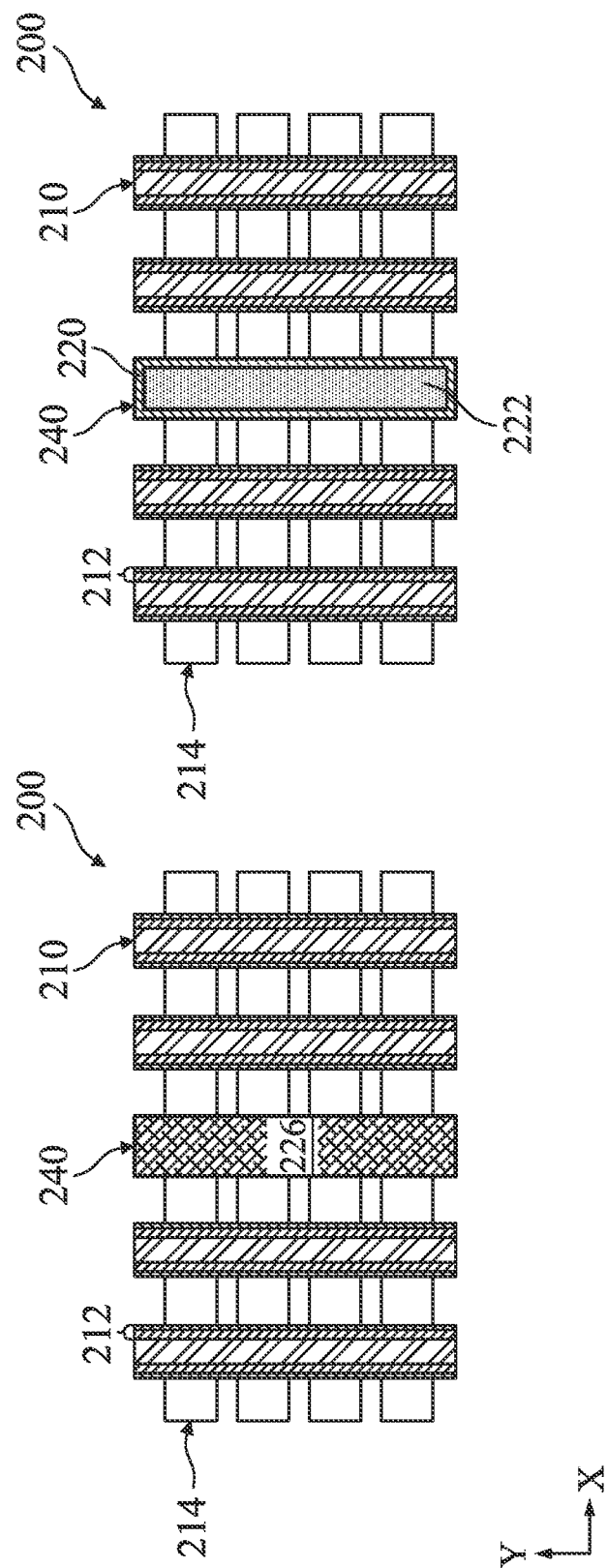

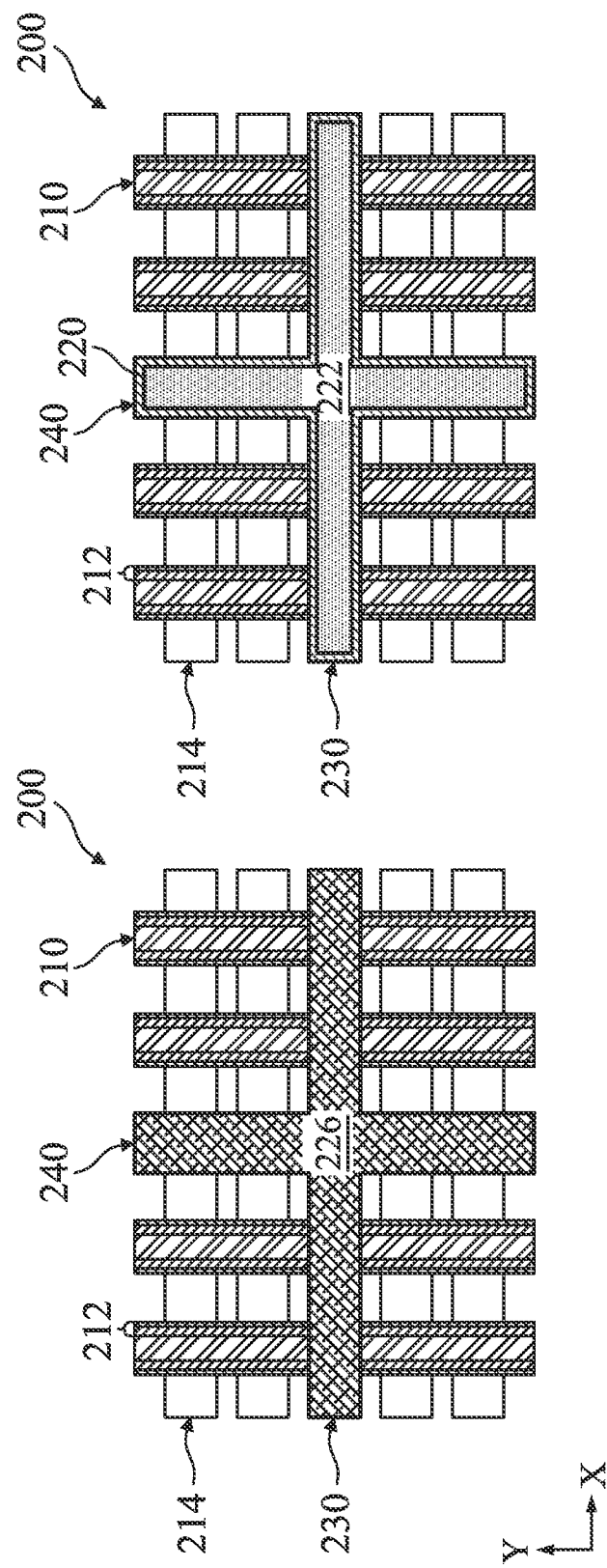

METHODS OF REDUCING CAPACITANCE IN FIELD-EFFECT TRANSISTORS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Such scaling down has also increased the complexity of processing and manufacturing ICs and, for these advances to be realized, similar developments in IC processing and manufacturing are needed. For example, various methods have been developed to cut (or separate) metal gate stacks in forming advanced ICs. While they have been generally adequate in providing isolation for metal gate stacks, they have not been satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C, 3D, 3E, 3F, 3G, 4A, 4B, and 4C show cross-sectional views taken along line A-A' of the semiconductor structure of FIGS. 2A and/or 2B during intermediate steps of implementing an embodiment of the method of FIGS. 1A, 1B, 1C, and/or 1D according to aspects of the present disclosure.

FIG. 4D is a planar top view of the semiconductor structure of FIGS. 2A, 2B, and/or 4C implemented with an embodiment of the method of FIGS. 1A, 1B, 1C, and/or 1D according to aspects of the present disclosure.

FIG. 4E is a cross-sectional view taken along line C-C' of the semiconductor structure of FIGS. 2A, 2B, and/or 4C implemented with an embodiment of the method of FIGS. 1A, 1B, 1C, and/or 1D according to aspects of the present disclosure.

FIGS. 6A, 6B, 6C, 6D, 6E, 6F, 6G, 6H, 6I, 6J, 6K, 7A, and 7B show cross-sectional views taken along line B-B' of the semiconductor structure of FIGS. 2A and/or 2B during intermediate steps of implementing an embodiment of the method of FIGS. 1A, 1B, 1C, and/or 1D according to aspects of the present disclosure.

FIG. 6L is a planar top view of the semiconductor structure of FIGS. 2A, 2B, and/or 6I implemented with an embodiment of the method of FIGS. 1A, 1B, 1C, and/or 1D according to aspects of the present disclosure.

FIG. 6M is a cross-sectional view taken along line C-C' of the semiconductor structure of FIGS. 2A, 2B, 6I, and/or 6K implemented with an embodiment of the method of FIGS. 1A, 1B, 1C, and/or 1D according to aspects of the present disclosure.

FIG. 8A is a planar top view of the semiconductor structure of FIGS. 2A, 2B, 3F, and/or 6I implemented with an embodiment of the method of FIGS. 1A, 1B, 1C, and/or 1D according to aspects of the present disclosure.

FIG. 8B is a cross-sectional view taken along line C-C' of the semiconductor structure of FIGS. 2A, 2B, 3F, 3G, 6I, and/or 6K implemented with an embodiment of the method of FIGS. 1A, 1B, 1C, and/or 1D according to aspects of the present disclosure.

DETAILED DESCRIPTION

Figure 1A:
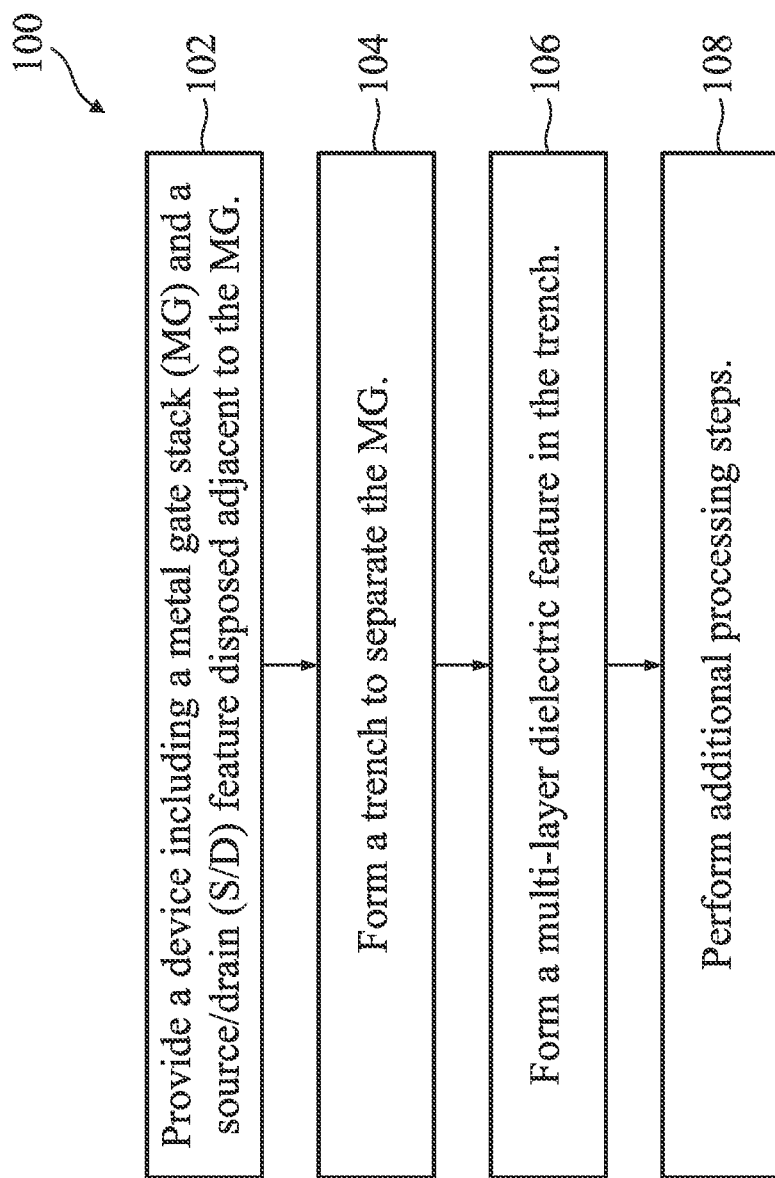
FIGS. 1A, 1B, 1C, and 1D each illustrates a flow chart of a method for forming a semiconductor structure or a portion thereof according to aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and fabrication methods, and more particularly to fabricating gate isolation features in semiconductor devices.

Replacing polysilicon gates with high-k metal gate (HKMG) structures has brought about improvement in device performance as feature sizes continue to decrease. Generally, after a HKMG structure is formed in a three-dimensional field effect transistor (e.g., a fin-like field effect transistor, or FinFET, a gate-all-around FET, or GAA FET, etc.), a number of methods may be implemented independently or in combination to further process the HKMG structure according specific design requirements. In one example, the HKMG structure may be cut into two or more portions and subsequently separated by gate isolation feature(s) in a process referred to as cut-metal-gate, or CMG. The gate isolation features are oriented lengthwise in a direction generally perpendicular to the direction of the HKMG structures. In another example, a dielectric gate known as continuous poly on diffusion edge (or CPODE) may be implemented to reduce a gate pitch between adjacent HKMG structures and is thus oriented lengthwise in a direction generally parallel to the direction of the HKMG structures. While these methods have been generally adequate, they have not been entirely satisfactory in all aspects. For instance, the use of high-k dielectric materials, which are dielectric materials having a dielectric constant greater than that of silicon oxide (k~3.9), in a gate isolation feature (alternatively referred to as gate cut feature) generally increases effective capacitance ($C_{eff}$) of the gate isolation feature, which in turn increases parasitic capacitance between the HKMG structures separated by such isolation feature. In many instances, increase in parasitic capacitance may lead to compromised device performance as it generally increases the RC delay of devices. Additionally, high-k dielectric materials implemented for CPODEs may also result in high parasitic capacitance for similar reasons. Unless otherwise noted below, comparison between capacitance or $C_{eff}$ of different structures is generally equivalent to comparing the dielectric constants of the material(s) included in such structures, which assumes that other factors affecting the value of capacitance (e.g., area of and separation distance between the conductive features). Thus, improvements in methods of processing HKMG structure with reduced parasitic capacitance are desired.

Figures 1B, 1C:
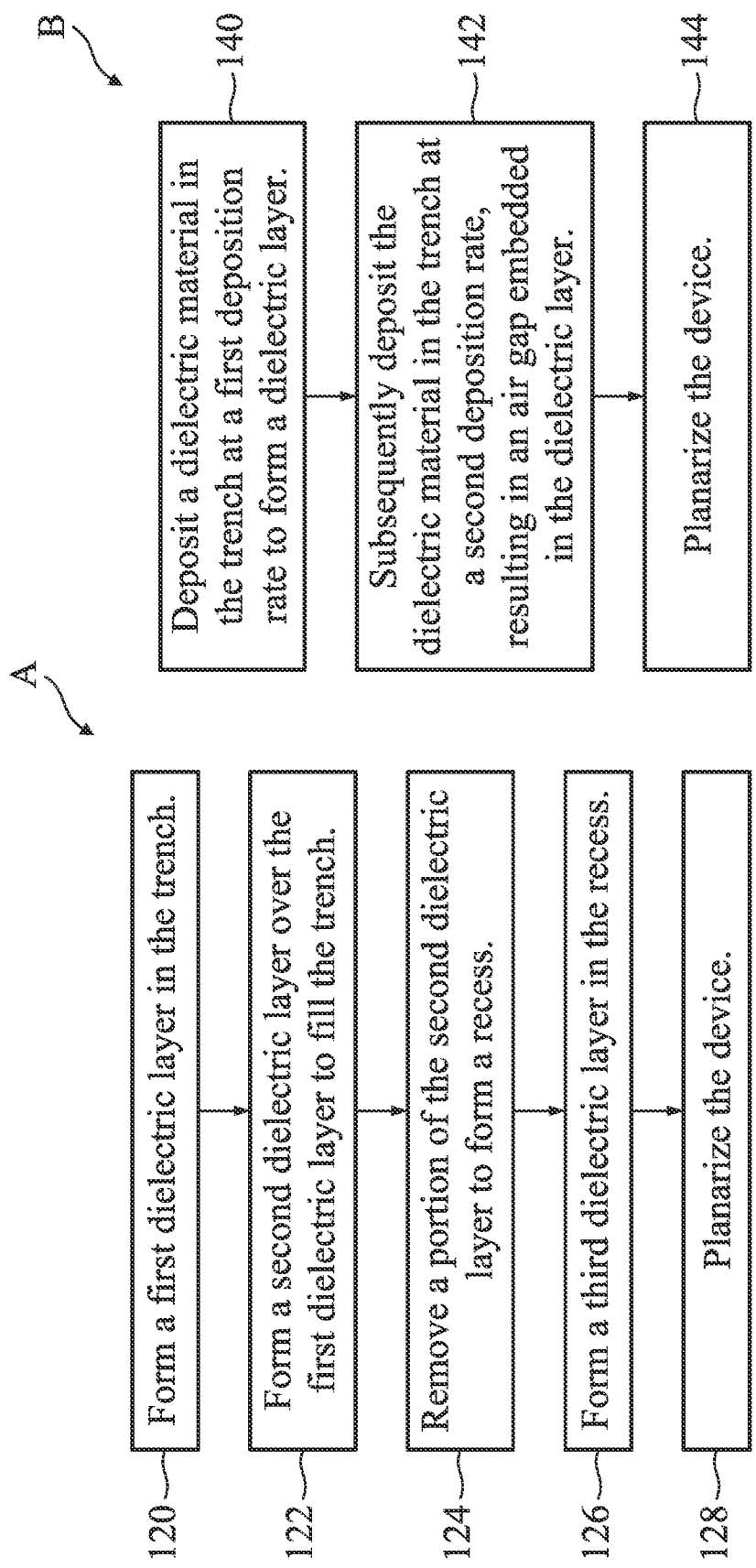
Figures 2A, 2B:
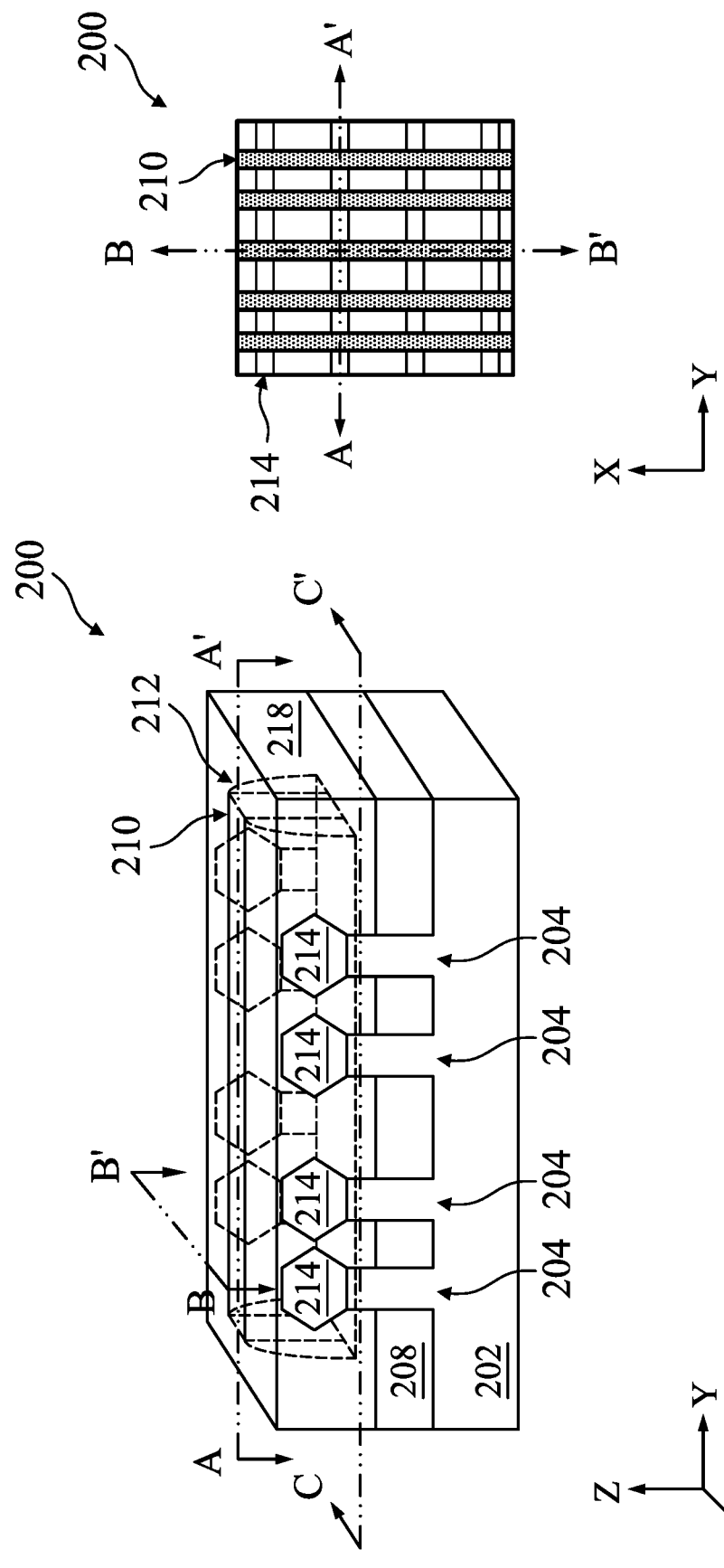
FIG. 2A shows a three-dimensional perspective view of a semiconductor structure implemented with an embodiment of the method of FIGS. 1A, 1B, 1C, and/or 1D according to aspects of the present disclosure.
FIG. 2B shows a planar top view of the semiconductor structure of FIG. 2A according to aspects of the present disclosure.

FIGS. 1A, 1B, and 1C together illustrate processing flow of a method 100 for forming a device 200 in accordance with some embodiments of the present disclosure. The method 100 is merely an example and is not intended to limit the present disclosure beyond what is explicitly recited in the claims. Additional operations can be performed before, during, and after the method 100, and some operations described can be replaced, eliminated, or moved around for additional embodiments of the method. The method 100 is described below in conjunction with FIGS. 2A-4E, of which, FIGS. 2A-3G and 4A-4C illustrate various cross-sectional views of the device 200 taken along the line A-A' as shown in FIGS. 2A and 2B during intermediate steps of the method 100; FIGS. 3H and 4D illustrate planar top views of the device 200; and FIGS. 3I and 4E illustrate cross-sectional views of the device 200 taken along the line C-C' as shown in FIG. 2A.

The device 200 may be an intermediate device fabricated during processing of an IC, or a portion thereof, that may include static random-access memory (SRAM) and/or other logic circuits, passive components such as resistors, capacitors, and inductors, and active components such as p-type FETs (PFETs), n-type FETs (NFETs), FinFETs, gate-all-around (GAA) FETs, metal-oxide semiconductor field effect transistors (MOSFETs), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations. For example, though the device 200 as illustrated is a three-dimensional FinFET device, the present disclosure may also provide embodiments for fabricating planar FET devices or GAA devices. Additional features can be added to the device 200, and some of the features described below can be replaced, modified, or eliminated in other embodiments of the device 200.

At operation 102, referring to FIGS. 1A, 2A, 2B, and 3A, the method 100 provides, or is provided with, the device 200 that includes a substrate 202 having at least one semiconductor layer 204 (e.g., an active region such as a three-dimensional fin; hereafter referred to as a fin 204) disposed thereon, isolation structures 208 disposed over the substrate 202 separating various components of the device 200, a high-k metal gate (HKMG) structure 210 disposed over the fins 204, gate spacers 212 disposed on sidewalls of the HKMG structure 210, S/D features 214 disposed over the fins 204 and interposing HKMG structures 210, and an interlayer dielectric (ILD) layer 218 disposed over the S/D features 214. As depicted herein, the device 200 may include multiple fins 204 oriented lengthwise along the X direction and multiple HKMG structures 210 oriented lengthwise along the Y direction, i.e., generally perpendicular to the fin 204. The device 200 may further include numerous other features such as, for example, hard mask layers, etch-stop layers, barrier layers, other suitable layers, or combinations thereof. For purpose of simplicity, intermediate steps of the method 100 are hereafter described with reference to cross-sectional views (FIGS. 3A-4C) of the device 200 taken along a length of the HKMG structure 210 (i.e., the dashed line A-A' in the Y direction).

The substrate 202 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

The fins 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 204 on the substrate 202. The etching process may include dry etching, wet etching, reactive ion etching (RIE), and/or other suitable processes.

Numerous other embodiments of methods for forming the fins 204 may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The isolation structures 208 may include silicon oxide, silicon nitride, silicon oxynitride, a low-k dielectric material, and/or other suitable materials. The isolation structures 208 may include shallow trench isolation (STI) features. In one embodiment, the isolation structures 208 are formed by etching trenches in the substrate 202 during the formation of the fin 204. The trenches may then be filled with an isolating material described above by a deposition process, followed by a chemical mechanical planarization (CMP) process. Other isolation structure such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers. The isolation structures 208 may be deposited by any suitable method, such as chemical vapor deposition (CVD), flowable CVD (FCVD), spin-on-glass (SOG), other suitable methods, or combinations thereof.

Still referring to FIGS. 2A and 2B, the device 200 includes S/D features 214 disposed in or over the fin 204 and adjacent each HKMG structure 210. The S/D features 214 may be formed by any suitable techniques, such as etching processes followed by one or more epitaxial processes. In one example, one or more etching processes are performed to remove portions of the fin 204 to form recesses (not shown) therein. A cleaning process may be performed to clean the recesses with a hydrofluoric acid (HF) solution and/or other suitable solutions. Subsequently, one or more epitaxial growth processes are performed to grow epitaxial features in the recesses. Each of the S/D features 214 may be suitable for forming a p-type FinFET device (e.g., including a p-type epitaxial material) or alternatively, an n-type FinFET device (e.g., including an n-type epitaxial material).

The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopant.

The device 200 may further include multiple HKMG structures 210 disposed over the fins 204. Each HKMG structure 210 may include a high-k dielectric layer (not depicted) disposed over the fin 204 and a metal gate electrode (not depicted) disposed over the high-k dielectric layer. The metal gate electrode may further include at least one work function metal layer and a bulk conductive layer disposed thereover. The work function metal layer may be a p-type or an n-type work function metal layer. Example work function materials include TiN, TaN, Ru, Mo, Al, WN, $ZrSi_2$, $MoSi_2$, $TaSi_2$, $NiSi_2$, Ti, Ag, TaAl, $TaA_1C$, TiAlN, TaC, TaCN, TaSiN, Mn, Zr, other suitable work function materials, or combinations thereof. The bulk conductive layer may include Cu, W, Al, Co, Ru, other suitable materials, or combinations thereof. The HKMG structure 210 may further include other layers (not depicted), such as an interfacial layer disposed between the fin 204 and the high-k dielectric layer, capping layers, barrier layers, other suitable layers, or combinations thereof. Various layers of the HKMG structure 210 may be deposited by any suitable method, such as chemical oxidation, thermal oxidation, atomic layer deposition (ALD), CVD, physical vapor deposition (PVD), plating, other suitable methods, or combinations thereof.

The device 200 may further include gate spacers 212 disposed on sidewalls of the HKMG structure 210. In some embodiments, the gate spacers 212 include one or more of the following elements: silicon, oxygen, nitrogen, and carbon. For example, the gate spacers 212 may include a dielectric material such as silicon oxide, carbon-doped silicon oxide, silicon nitride, carbon- and/or oxygen-doped silicon nitride, silicon carbide, silicon oxynitride, silicon oxycarbide, other suitable dielectric materials, or combinations thereof. The gate spacers 212 may be formed by first depositing a blanket of spacer material over the device 200, and then performing an anisotropic etching process to remove portions of the spacer material to form the gate spacers 212 on the sidewalls of the HKMG structure 210.

In some embodiments, the HKMG structures 210 are formed after other components of the device 200 (e.g., the S/D features 214) are fabricated. Such process is generally referred to as a gate replacement process, which includes first forming a dummy gate structure (not depicted) as a placeholder for the HKMG structure 210, forming the S/D features 214, forming the ILD layer 218 over the S/D features 214, planarizing the ILD layer 218 to expose a top surface of the dummy gate structure, removing the dummy gate structure to form a trench that exposes a channel region of the fin 204, and forming the HKMG structure 210 in the trench to complete the gate replacement process. Thereafter, a polishing process, such as a CMP process, may be performed to remove excess materials from a top surface of the HKMG structure 210 to planarize a top surface of the device 200. In some embodiments, the ILD layer 218 includes a dielectric material, such as silicon oxide, a low-k dielectric material, tetraethylorthosilicate (TEOS), doped silicon oxide such as borophosphosilicate glass (BPSG), fluoride-doped silicate glass (FSG), phosphosilicate glass (PSG), boron-doped silicate glass (BSG), other suitable dielectric materials, or combinations thereof. The ILD layer 218 may include a multi-layer structure or a single-layer structure and may be formed by a deposition process such as, for example, CVD, FCVD, SOG, other suitable methods, or combinations thereof. The device 200 may further include an etch-stop layer (not depicted) disposed between the HKMG structures 210 and the ILD layer 218 and may include silicon nitride, silicon oxynitride, silicon nitride with oxygen and/or carbon elements, aluminum oxide, aluminum nitride, other suitable materials, or combinations thereof. The etch-stop layer may be formed by CVD, PVD, ALD, other suitable methods, or combinations thereof.

In some embodiments, as discussed in detail below, method 100 implements a cut-metal-gate, or CMG, process during which the dummy gate structure is first replaced with an HKMG structure (e.g., HKMG structure 210) and the HKMG structure is subsequently cut by a gate isolation feature (e.g., dielectric feature 230). In alternative embodiments (not depicted), method 100 implements a cut-poly-gate, or CPG, process during which the dummy gate structure is cut by the same (or substantially similar) gate isolation feature into two portions and the resulting dummy gate structures are subsequently replaced with two HKMG structures. Notably, method 100 implements the same (or substantially similar) operations to form the gate isolation feature for both the CMG and the CPG processes.

Now referring to FIG. 3B, the method 100 at operation 104 forms a trench 213 in the HKMG structure 210. In the present embodiments, the trench 213 extends toward the substrate 202 to separate the HKMG structure 210 into two portions. In the depicted embodiments, the trench 213 extends to below a top surface of the substrate 202. In some embodiments, the trench 213 extends to above a top surface of the substrate 202 but below a bottom surface of the HKMG structure 210. The method 100 forms the trench 213 by implementing a series of patterning and etching processes. For example, a masking element (not depicted) may be formed over the HKMG structure 210 and subsequently patterned to expose a portion of the HKMG structure 210. Subsequently, the method 100 implements any suitable etching method (e.g., wet etching, dry etching, RIE, and/or other suitable etching methods) to remove the exposed portion of the HKMG structure 210 using the patterned masking element as an etch mask. In the present embodiments, the method 100 implements a dry etching method using an etchant that includes a chlorine-containing gas (e.g., $Cl_2$, $SiCl_4$, and/or $BCl_3$), a bromine-containing gas (e.g., HBr), a fluorine-containing gas (e.g., $CF_4$, $SF_6$, $CH_2F_2$, $CHF_3$, $NF_3$, and/or $C_2F_6$), a nitrogen-containing gas (e.g., $N_2$), an oxygen-containing gas (e.g., $O_2$), other suitable gases, or combinations thereof. Thereafter, the patterned masking element is removed from the device 200 by any suitable method such as wet etching or resist stripping.

Subsequently, the method 100 at operation 106 forms a multi-layer dielectric feature 230 (hereafter referred to as "dielectric feature 230"; see FIGS. 3G and 4C) in the trench 213. In the present embodiments, the method 100 proceeds in one of two pathways, A and B, for forming the dielectric feature 230. Referring to pathway A, referring to the process flow depicted in FIGS. 1B and 3B-3G, the method 100 forms a dielectric feature 230 that includes a dielectric layer (e.g., dielectric layer 222) embedded in one or two different dielectric layers (e.g., dielectric layers 220 and/or 226). With respect to pathway B, referring to the process flow depicted in FIGS. 1C and 4A-4C, the method 100 forms a dielectric feature 230 that includes an air gap (e.g., air gap 228) embedded in a dielectric layer (e.g., dielectric layer 220).

Details of the pathways A and B will be discussed in reference to their respective process flow below. Thereafter, at operation 108, the method 100 performs additional processing steps to the device 200. For example, additional vertical interconnect features such as contacts and/or vias, and/or horizontal interconnect features such as lines, and multilayer interconnect features such as metal layers and interlayer dielectrics can be formed over the device 200.

With respect to pathway A, referring to FIGS. 1B and 3B, the method 100 at operation 120 forms a dielectric layer 220 in the trench 213. As depicted herein, portions of the dielectric layer 220 may be formed on the top surface of the HKMG structure 210. In the present embodiments, the dielectric layer 220 includes a high-k dielectric material having a dielectric constant of greater than that of silicon oxide. In some examples, the dielectric layer 220 may include a nitrogen-containing dielectric material (e.g., silicon nitride, or carbon- and/or oxygen-doped silicon nitride, etc.), an oxygen-containing dielectric material (e.g., hafnium oxide, zirconium oxide, titanium oxide, etc.), other high-k dielectric materials, or combinations thereof. In some embodiments, the dielectric layer 220 serves as a barrier for preventing oxygen atoms from diffusing into the HKMG structure 210. In some embodiments, the dielectric layer 220 is free of silicon oxide and a low-k dielectric material (i.e., having a dielectric constant of less than that of silicon oxide, which is about 3.9) such as, for example, air, porous silicon oxide, doped silicon oxide (e.g., carbon-doped silicon oxide (SiOC), BPSG, FSG, PSG, BSG, etc.), other low-k dielectric materials, or combinations thereof. The dielectric layer 220 may be deposited by any suitable method including ALD, CVD, other suitable methods, or combinations thereof. In the present embodiments, the dielectric layer 220 is deposited by an ALD process.

Now referring to FIG. 3C, the method 100 at operation 122 forms a dielectric layer 222 over the dielectric layer 220, thereby filling the trench 213. Notably, the composition of the dielectric layer 222 is distinctly different from that of the dielectric layer 220 in that the dielectric constant of the dielectric layer 222 is lower than that of the dielectric layer 220. Throughout the present disclosure, the dielectric constant of a given dielectric layer generally refers to a composite dielectric constant based on the composition of the dielectric layer. For example, if more than one dielectric material is included in the dielectric layer 220, then the dielectric constant of the dielectric layer 220 reflects an average value of the dielectric constants of the materials included in the dielectric layer 220. In some instances, such composite dielectric constant may be computed based on the nature and the relative amounts of the different materials included in the dielectric layer 220. In some embodiments, difference in composition between the dielectric layers 220 and 222 ensures that a selective etching process may be implemented to remove one of the layers without removing or substantially removing the other one of the layers.

In the present embodiments, the dielectric layer 222 includes silicon oxide, a low-k dielectric material, or a combination thereof. The low-k dielectric material may include porous silicon oxide, doped silicon oxide (e.g., SiOC, BPSG, FSG, PSG, BSG, etc.), other low-k dielectric materials, or combinations thereof. In some embodiments, porosity of the dielectric layer 222 is greater than porosity of the dielectric layer 220. In other words, density of the dielectric layer 222 is less than density of the dielectric layer 220.

The dielectric layer 222 may be formed by any suitable method including CVD, FCVD, ALD, or a combination thereof. For embodiments in which FCVD is implemented, the dielectric layer 222 may be subsequently cured to harden and optionally annealed thereafter. In some embodiments, the curing process may be implemented using ultraviolet radiation at any suitable wavelength depending upon the composition of the dielectric layer 222. In some embodiments, the annealing process may be implemented at any suitable temperature so long as it does not thermally degrade other features of the device 200 (e.g., the S/D features 214, the HKMG structure 210, etc.).

Referring to FIG. 3D, the method 100 at operation 124 subsequently removes a portion of the dielectric layer 222 to form a recess 224. In the present embodiments, the dielectric layer 222 is selectively etched with respect to the dielectric layer 220, such that the dielectric layer 220 is not etched or only minimally etched at operation 124. The dielectric layer 222 may be selectively etched by any suitable etching process such as dry etching, wet etching, RIE, or combinations thereof. In the present embodiments, the dielectric layer 222 is etched by a dry etching process utilizing an etchant that includes a fluorine-containing gas (e.g., $CF_4$, $SF_6$, $CH_2F_2$, $CHF_3$, $NF_3$, and/or $C_2F_6$), a nitrogen-containing gas (e.g., $N_2$), a hydrogen-containing gas (e.g., $H_2$), an oxygen-containing gas (e.g., $O_2$, $CO_2$, COS), other suitable gases, or combinations thereof. As discussed above, compositions of the dielectric layer 220 and the dielectric layer 222 are chosen to ensure etching selectivity between the two layers when applying the etching process at operation 124.

Subsequently, referring to FIG. 3E, the method 100 at operation 126 forms a dielectric layer 226 over the dielectric layer 222, thereby filling the recess 224. In the depicted embodiments, a bottom portion of the dielectric layer 226 disposed in the recess 224 is defined by the dielectric layers 220 and 222, while a top portion of the dielectric layer 222 is disposed on a top surface of the HKMG structure 210. In the present embodiments, the dielectric layer 226 has a higher dielectric constant than the dielectric layer 222. In some embodiments, the dielectric layer 226 is the same as (or substantially similar to) the dielectric layer 220 in composition. The dielectric layer 226 may include a nitrogen-containing dielectric material (e.g., silicon nitride), an oxygen-containing dielectric material (e.g., hafnium oxide, zirconium oxide, or titanium oxide), other dielectric materials, or combinations thereof. In some embodiments, density of the dielectric layer 226 is greater than the density of the dielectric layer 222. In the present embodiments, due to the relatively porous structure of the dielectric layer 222 in comparison to the dielectric layer 226, the dielectric layer 226 is configured to protect the dielectric layer 222 from being inadvertently etched during subsequent processing steps.

The dielectric layer 226 may be formed by any suitable method including CVD, FCVD, ALD, or a combination thereof. In some embodiments, the dielectric layer 226 is formed in a similar process to that discussed above with respect to the dielectric layer 222. Thereafter, referring to FIG. 3F, the method 100 at operation 128 removes (by a CMP process, for example) the top portion of the dielectric layer 226 formed on the top surface of the HKMG structure 210, thereby planarizing a top surface of the device 200. As provided herein, the resulting dielectric feature 230 may be a gate isolation feature configured to separate the HKMG structure 210 into two portions, 210A and 210B. In other words, formation of the dielectric feature 230 results in the HKMG structure 210A and the HKMG structure 210B, each having a sidewall defined by the dielectric feature 230.

Figure 3F:
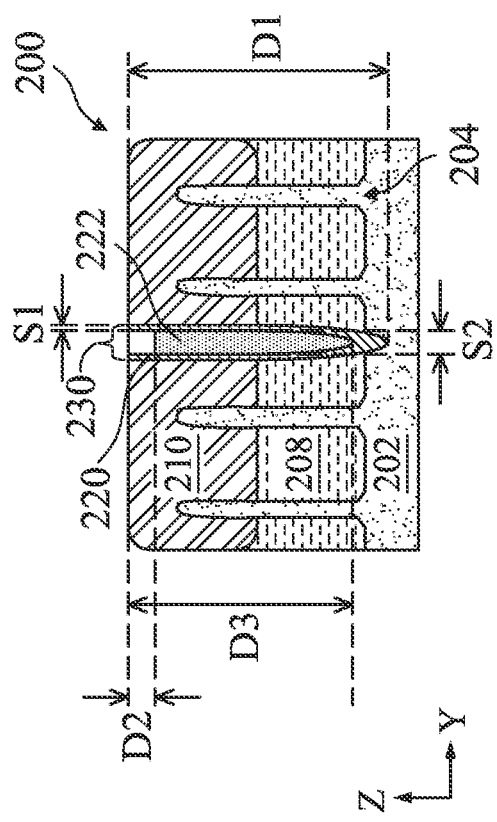

Still referring to FIG. 3F, a ratio of a thickness S2 of the dielectric layer 222 to a thickness S1 of the dielectric layer 220 may be greater than 0 and less than about 30, and a ratio of a height D3 of the dielectric layer 222 to a height D1 of the dielectric feature 230 may be greater than about 0.3 and less than about 0.8. On one hand, if the ratio of S2/S1 is greater than about 30 or if the ratio of D3/D1 is greater than about 0.8, the dielectric layer 220 may not be sufficiently thick to protect the HKMG structure 210 against diffusion of impurity atoms (e.g., oxygen atoms) from the dielectric layer 222. On the other hand, if the ratio of D3/D1 is less than about 0.3, the effect of reduction in $C_{eff}$, thus the improvement in device performance, may be negligible. In some examples, S1 may be greater than 0 nm and less than about 3 nm, S2 may be about 15 nm to about 25 nm, D1 may be about 50 nm to about 200 nm, and D3 may be about 35 nm to about 145 nm. D2, a height of the dielectric layer 226 (i.e., a difference of D1 and D3), may be about 2 nm at a minimum. Notably, if D2 is less than about 2 nm, the dielectric layer 226 may not provide sufficient protection for the dielectric layer 222 against subsequent processing steps (e.g., an etching process). Of course, these are example dimensions and do not limit embodiments provided by the present disclosure.

Figure 3G:
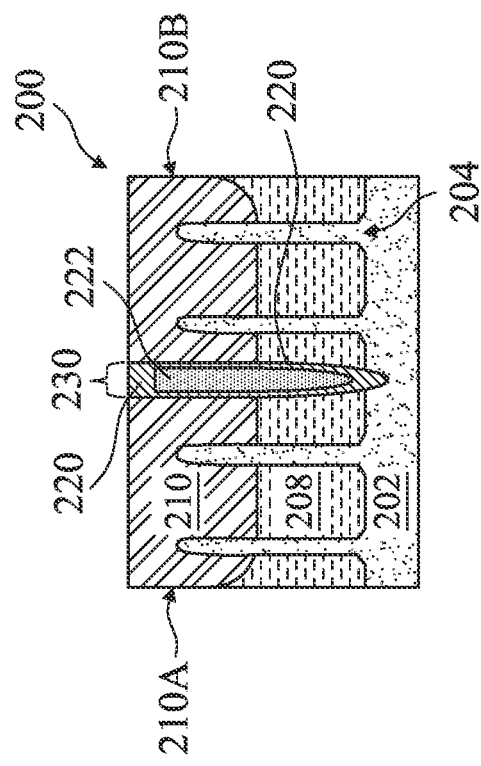
Figure 3H:
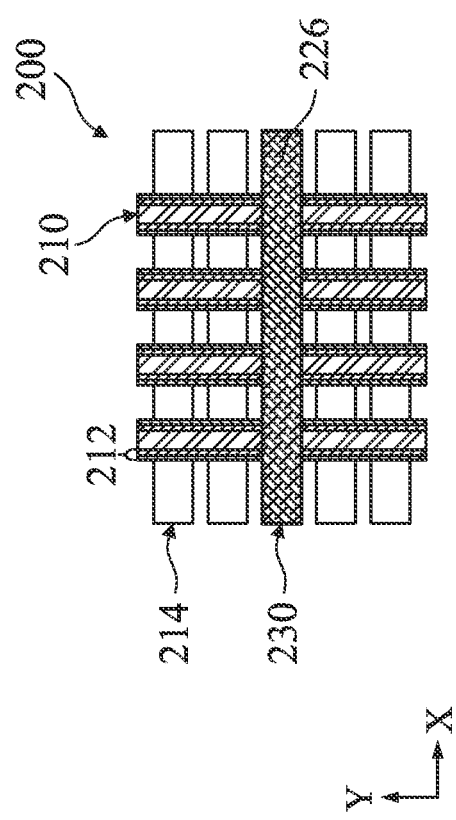
FIG. 3H is a planar top view of the semiconductor structure of FIGS. 2A, 2B, and/or 3F implemented with an embodiment of the method of FIGS. 1A, 1B, 1C, and/or 1D according to aspects of the present disclosure.
Figure 3I:
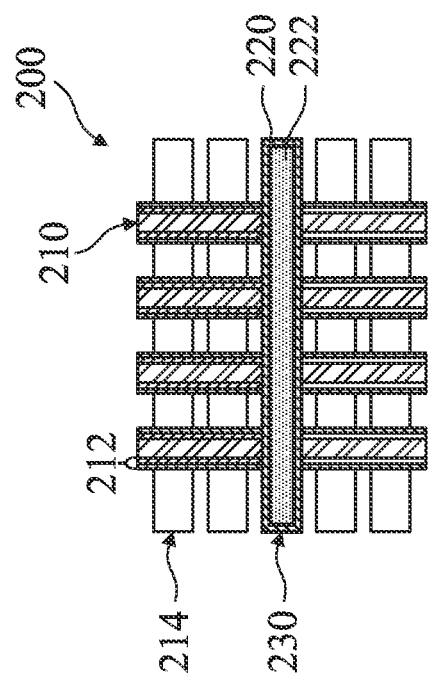
FIG. 3I is a cross-sectional view taken along line C-C' of the semiconductor structure of FIGS. 2A, 2B, 3F, and/or 3G implemented with an embodiment of the method of FIGS. 1A, 1B, 1C, and/or 1D according to aspects of the present disclosure.

In some embodiments, referring to FIG. 3G, the composition of the dielectric layer 226 is the same as that of the dielectric layer 220, such that the dielectric layer 222 is fully embedded in the dielectric layer 220. Accordingly, the multi-layer dielectric feature 230 may be a two-layer structure if the dielectric layer 226 and the dielectric layer 220 have the same composition or, alternatively, the dielectric feature 230 may be a three-layer structure if the dielectric layer 226 has a different composition from the dielectric layer 220. To better illustrate such embodiments, FIGS. 3H and 3I depict the device 200 taken at a planar top view (FIG. 3H) and at a cross-sectional view (FIG. 3I) along line C-C' as illustrated in FIG. 2A. Notably, for a three-layer structure as depicted in FIG. 3F, the planar top view of the device 200 shows the dielectric feature 230 including the dielectric layer 226 in FIG. 3H, while the cross-sectional view in FIG. 3I shows the dielectric feature 230 including the dielectric layer 222 embedded in the dielectric layer 220. For a two-layer structure as depicted in FIG. 3G, the planar top view (not depicted) shows the dielectric feature 230 would only include the dielectric layer 220, while the cross-sectional view (not depicted) along the line C-C' would depict a similar structure as that depicted in FIG. 3I.

In some embodiments, referring to pathway B in FIG. 1C and FIGS. 4A-4E, the method 100 forms a dielectric feature 230 that includes an air gap 228, which has a dielectric constant of about 1, embedded in the dielectric layer 220. Referring to FIG. 4A, the method 100 at operation 140 conformally forms the dielectric layer 220 in the trench 213 in a first deposition process. The first deposition process at operation 140 may be any suitable process including ALD, CVD, FCVD, other suitable processes, or combinations thereof. Subsequently, referring to FIG. 4B, the method 100 implements a second deposition process at operation 142 during which the same dielectric material (i.e., the composition of the dielectric layer 220) deposited during the first deposition process is deposited during the second deposition process but at a different deposition rate. In the present embodiments, the second deposition process is implemented at a higher rate than the first deposition process.

Notably, due to the high aspect ratio (at least about 1:10) of the trench 213, a higher deposition rate may cause the dielectric material to quickly accumulate and bridge across the opening of the trench 213, thereby preventing additional material from being deposited in the trench 213 and resulting in the air gap 228 formed in the dielectric layer 220. The second deposition process at operation 142 may be any suitable process including ALD, CVD, FCVD, other suitable processes, or combinations thereof. In some embodiments, the first deposition process at operation 140 and the second deposition process at operation 142 are substantially the same process but are implemented at different deposition rates as provided herein. In some embodiments, the first deposition process is an ALD process and the second deposition process is a CVD process. Thereafter, referring to FIG. 4C, the method 100 at operation 144 performs a planarization process (e.g., a CMP process) to the device 200 similar to that discussed above with respect to operation 128. Accordingly, referring to FIGS. 4D and 4E, the planar top view (FIG. 4D) of the device 200 shows the dielectric feature 230 including the dielectric layer 220, while the cross-sectional view (FIG. 4E) of the device 200 taken along the line C-C' of FIG. 2A shows the dielectric feature 230 including the air gap 228 embedded in or surrounded by the dielectric layer 220.

Figure 5:
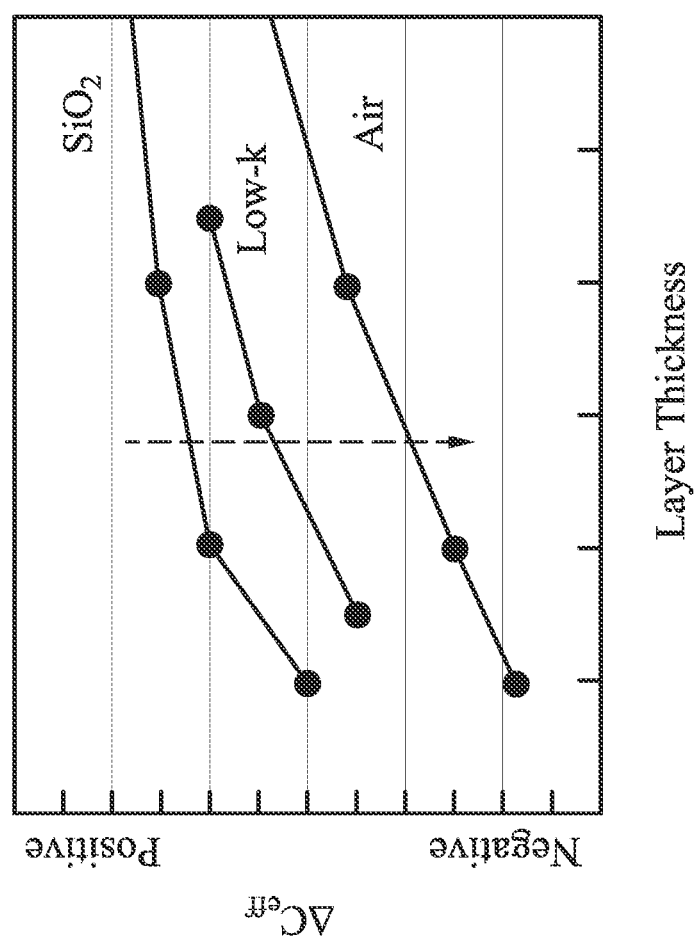
FIG. 5 is a schematic illustration of effects of various compositions on reducing effective capacitance of the semiconductor structure implemented with an embodiment of the method of FIGS. 1A, 1B, 1C, and/or 1D according to aspects of the present disclosure.

Accordingly, the present disclosure provides a gate isolation feature, such as the dielectric feature 230, that includes an inner layer embedded in at least one outer layer that is different from the inner layer with respect to composition. In some embodiments, as depicted in FIG. 3G, the dielectric feature 230 includes the dielectric layer 222 embedded in one outer layer, i.e., the dielectric layer 220, forming a two-layer structure. In some embodiments, as depicted in FIG. 4C, the dielectric feature 230 includes the air gap 228 embedded in the dielectric layer 220. In some embodiments, as depicted in FIG. 3F, the dielectric feature 230 includes the dielectric layer 222 embedded in two outer layers, i.e., the dielectric layers 220 and 226, forming a three-layer structure. Notably, the dielectric constant of the dielectric layer 222 is less than that of the dielectric layer 220 and/or the dielectric layer 226. As a result, regardless of whether the dielectric feature 230 is a two-layer or a three-layer structure, the dielectric layer 222 is configured to reduce the overall $C_{eff}$ of the dielectric feature 230, which varies proportionally to the dielectric constant of each material layer included in the dielectric feature 230. FIG. 5 illustrates the effects of various compositions of the dielectric layer 222 on the reduction in $C_{eff}$ (negative $\Delta C_{eff}$) of an example two-layer structure that includes silicon nitride as the outer layer (i.e., the dielectric layer 220). The dotted arrow indicates a decrease in the dielectric constant from silicon oxide to air. At a given thickness of the dielectric layer 222 (shown on the x-axis), the material with the least dielectric constant produces the greatest reduction in $C_{eff}$, i.e., the most negative $\Delta C_{eff}$, and as the thickness increases the effect in reducing the $C_{eff}$ becomes less prominent, resulting in a more positive $\Delta C_{eff}$.

Figure 1D:
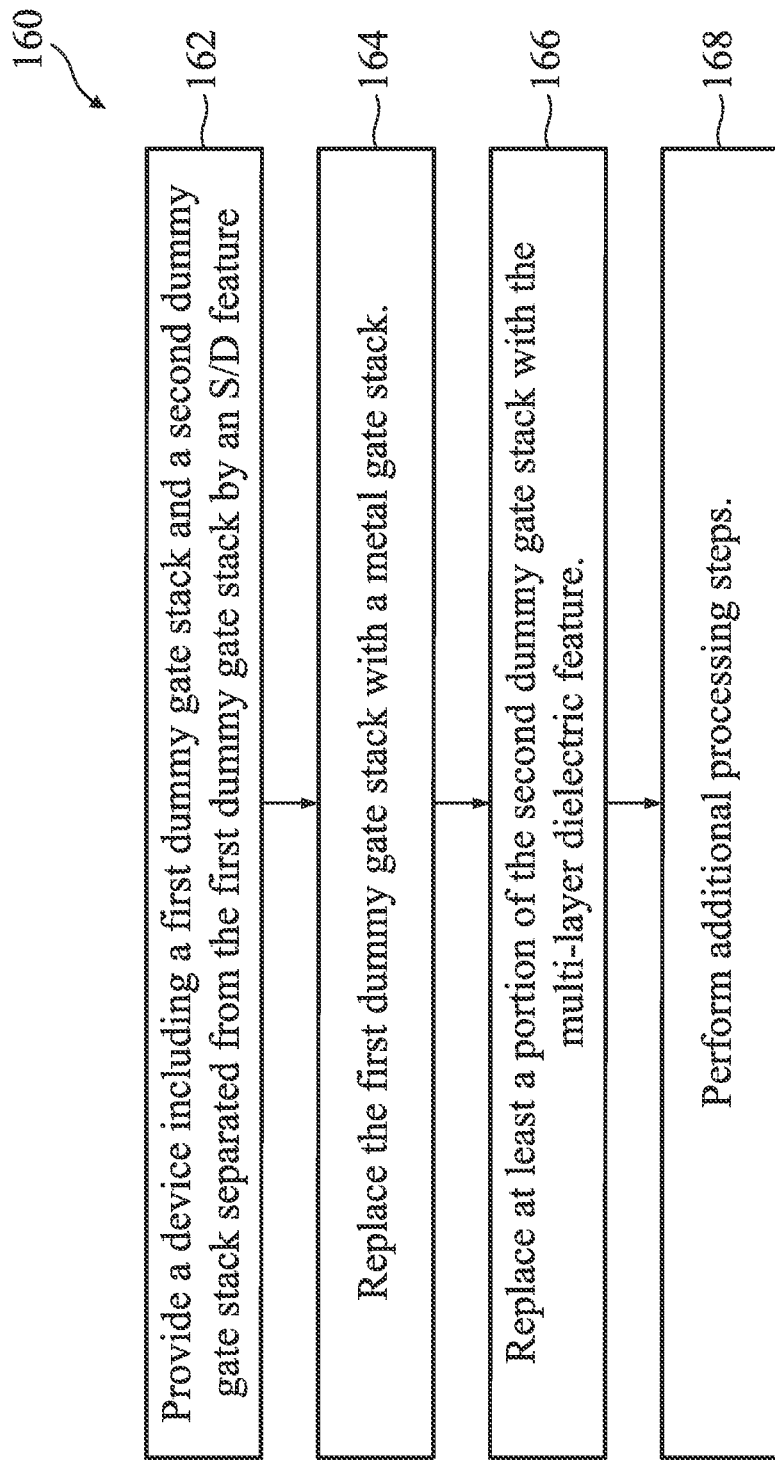
Figure 6E:
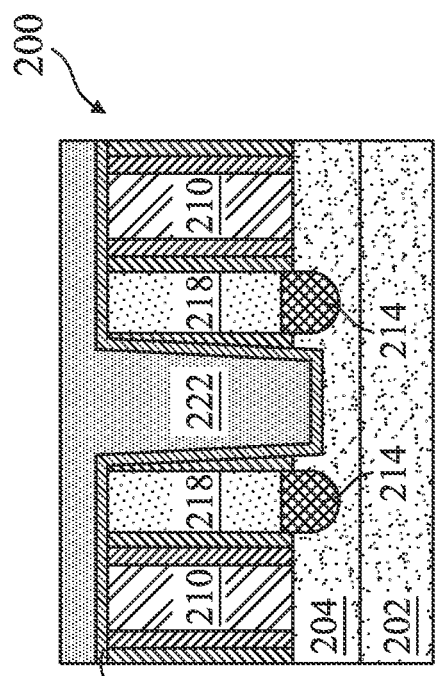

Now turning to FIG. 1D (in conjunction with FIGS. 1B and 1C), process flow of a method 160 is illustrated for forming the device 200 in accordance with some embodiments of the present disclosure. The method 160 is merely an example and is not intended to limit the present disclosure beyond what is explicitly recited in the claims. Additional operations can be performed before, during, and after the method 160, and some operations described can be replaced, eliminated, or moved around for additional embodiments of the method. For example, in some embodiments, the method 160 may implement operation 164 before implementing operation 166. Alternatively, in some embodiments, the method 160 may implement operation 166 before implementing operation 164. The method 160 is described below in reference to FIGS. 6A-7D; of which, FIGS. 6A-6K, 7A, and 7B illustrate various cross-sectional views of the device 200 taken along the line A-A' as shown in FIGS. 2A and 2B during intermediate steps of the method 160; FIGS. 6L and 7C illustrate planar top views of the device 200; and FIGS. 6M and 7D illustrate cross-sectional views of the device 200 taken along the line C-C' as shown in FIG. 2A.

While the method 100 is generally directed to a method of forming a gate isolation feature for the HKMG structure 210 in the device 200, the method 160 is generally directed to a method of forming a CPODE in the device 200. As discussed above, the dielectric feature 230 is configured to separate or cut an HKMG structure into multiple HKMG structures and is thus oriented lengthwise in a direction generally perpendicular to the lengthwise direction of the HKMG structures 210. The CPODE, on the other hand, is configured to reduce a gate pitch between two adjacent HKMG structures and is thus oriented lengthwise in a direction generally parallel to the HKMG structures 210. Because the CPODE generally includes dielectric material(s), present embodiments directed to methods of forming a gate isolation feature with reduced $C_{eff}$ may also be applicable for forming a CPODE with reduced $C_{eff}$. It is noted that components of the device 200 discussed below with reference to the method 160 will be referred to by the same notations as those discussed above with reference to the method 100.

Referring to FIG. 6A, method 160 at operation 162 provides (or is provided with) the device 200 including the substrate 202, dummy gate stacks 206 disposed over the fin 204 and in the ILD layer 218, the gate spacers 212 disposed on sidewalls of the dummy gate stacks 206, and S/D features 214 disposed over the fin 204 and interposing the dummy gate stacks 206. Of course, the device 200 may include numerous other components as discussed in detail above. In the present embodiments, the gate spacers 212 include two spacer layers, 212a and 212b, that have different compositions. In some embodiments, the spacer layer 212a includes silicon oxide, a low-k dielectric material, or a combination thereof, and the spacer layer 212b includes a high-k dielectric material such as a nitrogen-containing dielectric material (e.g., silicon nitride, carbon-and/or oxygen-doped silicon nitride, etc.), an oxygen-containing dielectric material (e.g., hafnium oxide, zirconium oxide, titanium oxide, etc.), other high-k dielectric materials, or combinations thereof.

Referring to FIGS. 6B and 6C, the method 160 at operation 164 replaces one of the dummy gate stacks 206 with a HKMG structure 210 in a process substantially similar to that discussed above with respect to operation 102 of the method 100 and depicted in FIGS. 2A, 2B, and 3A. Briefly, the method 160 at operation 164 removes the dummy gate structure 206 to form a gate trench 207 that exposes a channel region of the fin 204, and deposits various material layers such as an interfacial layer, a high-k gate dielectric layer, a work-function metal layer, a barrier layer, a capping layer, a bulk conductive layer, other suitable layers, or combinations thereof in the gate trench 207 to form the HKMG structure 210. Various material layers of the HKMG structure 210 may be deposited by any suitable method, such as chemical oxidation, thermal oxidation, ALD, CVD, PVD, plating, other suitable methods, or combinations thereof. Thereafter, a CMP process may be performed to planarize a top surface of the device 200.

Now referring to FIGS. 6D-6I, the method 160 at operation 166 replaces a portion of one of the dummy gate stacks 206 with a multi-layer dielectric feature 240 (hereafter refer to as dielectric feature 240). In the present embodiments, the method 160 at operation 166 replaces a dummy gate stack 206 disposed between two HKMG structures 210. Referring to FIG. 6D, the method 160 at operation 166 removes the dummy gate stack 206 to form a trench 234 disposed between two HKMG structures 210. Forming the trench 234 may include implementing in a series of patterning and etching processes similar to those discussed above with respect to forming the trench 213 at operation 104. In the depicted embodiments, forming the trench 234 removes a portion of the fin 204, such that the trench 234 extends to below a top surface of the fin 204. In some embodiments, the method 160 at operation 166 completely removes the portion of the fin 204, such that the trench 234 extends to below a top surface of the substrate 202. In some embodiments, removing the dummy gate stack 206 removes portions of the gate spacers 212. As depicted herein, the method 160 may completely remove the spacer layer 212a and partially remove the spacer 212b. Accordingly, sidewalls of the trench 234 may be partially defined by the spacer layer 212b. Of course, the present disclosure is not limited to such configuration and may completely remove both the spacer layers 212a and 212b.

Subsequently, referring collectively to FIGS. 6E-6I, the method 160 at operation 166 implements either pathway A or pathway B as depicted in FIGS. 1B and 1C, respectively, to form the dielectric feature 240 in the trench 234. Thereafter, at operation 168, which is similar to operation 108, the method 160 performs additional processing steps to the device 200. For example, additional vertical interconnect features such as contacts and/or vias, and/or horizontal interconnect features such as lines, and multilayer interconnect features such as metal layers and interlayer dielectrics can be formed over the device 200.

With respect to pathway A, for example, referring to FIGS. 1B and 6E, the method 160 forms the dielectric layer 220 in the trench 234 in a process similar to operation 120 discussed above with reference to FIG. 3B. Briefly, the dielectric layer 220 may include a nitrogen-containing dielectric material (e.g., silicon nitride, carbon- and/or oxygen-doped silicon nitride, etc.), an oxygen-containing dielectric material (e.g., hafnium oxide, zirconium oxide, titanium oxide, etc.), other high-k dielectric materials, or combinations thereof. The dielectric layer 220 may be deposited by any suitable method including ALD, CVD, other suitable methods, or combinations thereof. In the present embodiments, the dielectric layer 220 is deposited using an ALD process.

Figure 6F:
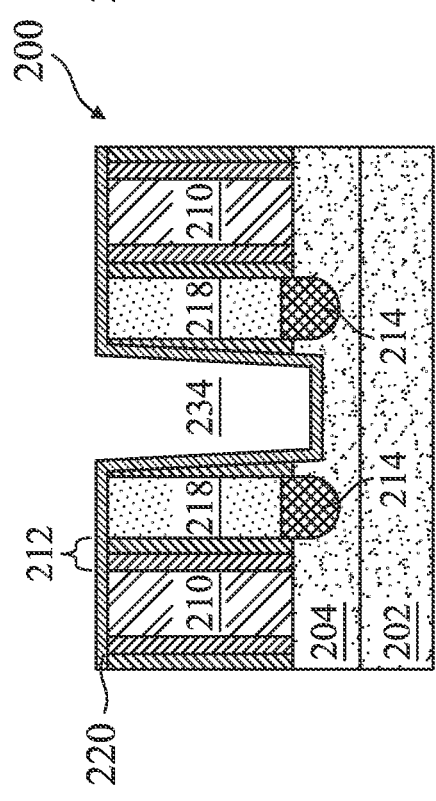

Referring to FIG. 6F, the method 160 forms the dielectric layer 222 over the dielectric layer 220, thereby filling the trench 234 in a process similar to operation 122 discussed above with reference to FIG. 3C. Briefly, the dielectric layer 222 may include silicon oxide, a low-k dielectric material, or a combination thereof. The low-k dielectric material may include porous silicon oxide, doped silicon oxide (e.g., SiOC, BPSG, FSG, PSG, BSG, etc.), other low-k dielectric materials, or combinations thereof. The dielectric layer 222 may be formed by any suitable method including CVD, FCVD, ALD, or a combination thereof.

Figure 6G:
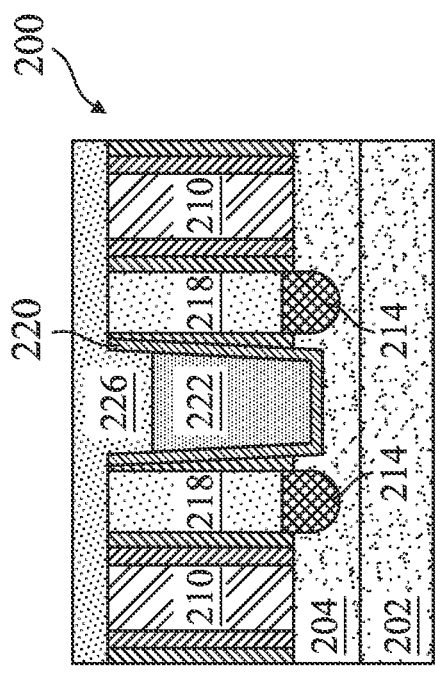

Now referring to FIG. 6G, the method 160 subsequently removes a portion of the dielectric layer 222 to form the recess 224 in a process similar to operation 124 discussed above with reference to FIG. 3D. For example, the dielectric layer 222 is selectively etched with respect to the dielectric layer 220, such that the dielectric layer 222 is not etched or only minimally etched by any suitable etching process such as dry etching, wet etching, RIE, or combinations thereof. In the present embodiments, the dielectric layer 222 is etched by a dry etching process utilizing an etchant that includes a fluorine-containing gas (e.g., $CF_4$, $SF_6$, $CH_2F_2$, $CHF_3$, $NF_3$, and/or $C_2F_6$), a nitrogen-containing gas (e.g., $N_2$), a hydrogen-containing gas (e.g., $H_2$), an oxygen-containing gas (e.g., $O_2$, $CO_2$, COS), other suitable gases, or combinations thereof.

Figure 6H:
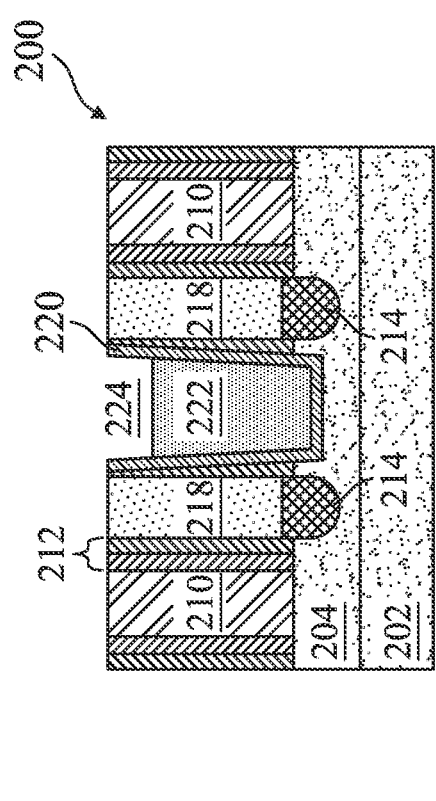

Referring to FIG. 6H, the method 160 forms the dielectric layer 226 over the dielectric layer 222, thereby filling the recess 224 in a process similar to operation 126 discussed above with reference to FIG. 3E. For example, the dielectric layer 226 may include a nitrogen-containing dielectric material (e.g., silicon nitride, carbon- and/or oxygen-doped silicon nitride, etc.), an oxygen-containing dielectric material (e.g., hafnium oxide, zirconium oxide, titanium oxide, etc.), other dielectric materials, or combinations thereof. The dielectric layer 226 may be formed by any suitable method including CVD, FCVD, ALD, or a combination thereof. In some embodiments, the dielectric layer 226 is the same as (or substantially similar to) the dielectric layer 220 in composition.

Thereafter, referring to FIG. 6I, the method 160 removes (by a CMP process, for example) the portion of the dielectric layer 226 formed over the top surface of the HKMG structure 210, thereby planarizing a top surface of the device 200 in a process similar to operation 128 discussed above. The resulting dielectric feature 240 may be a CPODE configured to reduce a gate pitch between the HKMG structures 210 disposed on both sides of the dielectric feature 240. Generally, in the absence of the dielectric feature 240, a separation distance between adjacent S/D features 214 disposed on both sides of an active edge (defining two adjacent active regions of the device 200) is often enlarged to prevent shorting and to ensure proper device performance. In an effort to reduce feature sizes (e.g., reduction in SRAM cell size), a CPODE such as the dielectric feature 240 may be implemented at the active edge to provide sufficient insulation without the need to enlarge the separation distance between the S/D features 214. However, the use of high-k dielectric materials in the CPODE may increase the parasitic capacitance between S/D features 214 of neighboring active regions. The present disclosure provides method of forming a CPODE with reduced $C_{eff}$, such that the parasitic capacitance between two conductive features may be reduced while maintaining the relatively small separation distance therebetween.

Still referring to FIG. 6I, various dimensions of the dielectric feature 240 are similar to those discussed above with respect to the dielectric feature 230 as shown in FIG. 3F. For example, a ratio of the thickness S2 of the dielectric layer 222 to the thickness S1 of the dielectric layer 220 may be greater than 0 and less than about 30, and a ratio of the height D3 of the dielectric layer 222 to the height D1 of the dielectric feature 230 may be greater than about 0.3 and less than about 0.8. Additionally, a sum of S1 and S2 is greater than a width of the HKMG structure 210 plus twice the thickness of the spacer layer 212a. In some examples, S1 may be greater than 0 nm and less than about 3 nm, S2 may be about 15 nm to about 25 nm, D1 may be about 50 nm to about 200 nm, D2 may be about 2 nm at a minimum, and D3 may be about 35 nm to about 145 nm. Of course, these are example dimensions and do not limit embodiments provided by the present disclosure.

In some embodiments, referring to FIGS. 6J and 5K, the composition of the dielectric layer 226 is the same as that of the dielectric layer 220, such that the dielectric layer 222 is fully embedded in the dielectric layer 220. Therefore, similar to the dielectric feature 230, the dielectric feature 240 may be a two-layer structure if the dielectric layer 226 and the dielectric layer 220 have the same composition or, alternatively, the dielectric feature 240 may be a three-layer structure if the dielectric layer 226 has a different composition from the dielectric layer 220. Furthermore, FIGS. 6L and 6M, similar to FIGS. 3H and 3I, depict the device 200 in a planar top view (FIG. 6L) and at a cross-sectional view (FIG. 6M) along line C-C' as illustrated in FIG. 2A, respectively. Notably, for a three-layer structure as depicted in FIG. 6I, the planar top view of the device 200 in FIG. 6L shows the dielectric feature 240 including the dielectric layer 226 as in FIG. 3H, while the cross-sectional view in FIG. 6K shows the dielectric feature 240 including the dielectric layer 222 embedded in the dielectric layer 220. For a two-layer structure as depicted in FIG. 6K, the planar top view (not depicted) of the dielectric feature 240 would only include the dielectric layer 220, while the cross-sectional view (not depicted) taken along the line C-C' would include a substantially similar structure as that depicted in FIG. 6M.

In some embodiments, similar to the discussion above with respect to FIGS. 4A-4E, the method 160 implements pathway B depicted in FIG. 1C to form a dielectric feature 240 that includes the air gap 228 at operation 166. For example, referring to FIG. 7A, the method 160 conformally forms the dielectric layer 220 in the trench 234 in a first deposition process similar to operation 140 as discussed above. The first deposition process may be any suitable process including ALD, CVD, FCVD, other suitable processes, or combinations thereof. Subsequently, still referring to FIG. 7A, the method 160 deposits the dielectric layer 220 in a second deposition process similar to operation 142 as discussed above at a deposition rate different from that of the first deposition process. In the present embodiments, the second deposition process is implemented at a higher rate than the first deposition process. The second deposition process may be any suitable process including ALD, CVD, FCVD, other suitable processes, or combinations thereof. As discussed above, a higher deposition rate causes the dielectric material to quickly accumulate and bridge across the opening of the trench 234, which prevents additional material from being deposited in the trench 234, resulting in the air gap 228 being embedded in the dielectric layer 220.

Figure 7A:
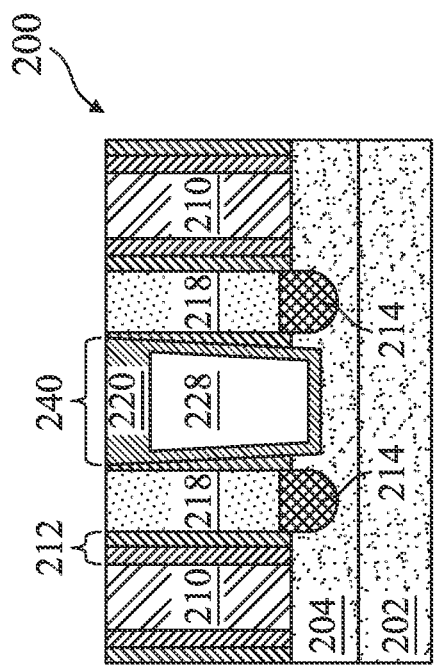
Figure 7B:
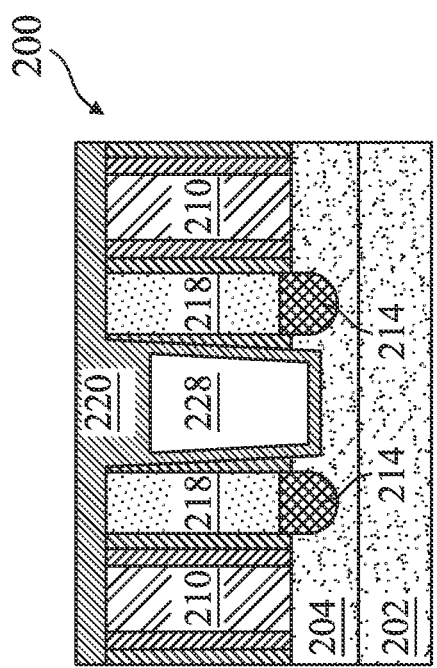
Figure 7C:
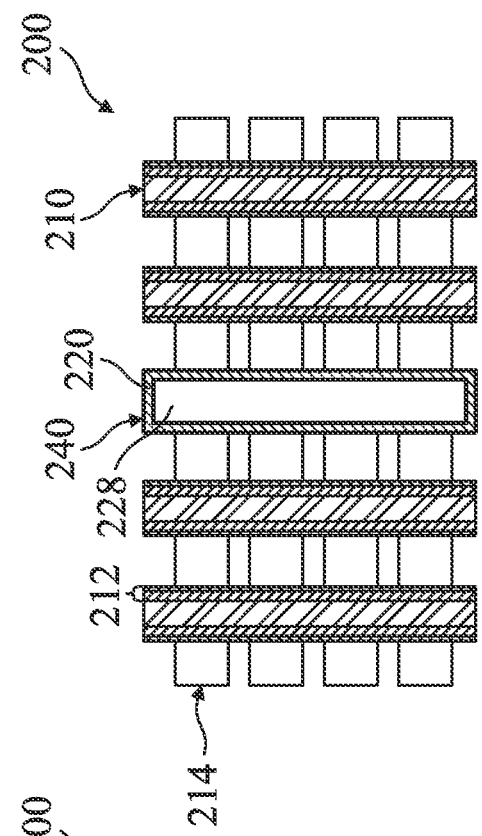
FIG. 7C is a planar top view of the semiconductor structure of FIGS. 2A, 2B, and/or 7B implemented with an embodiment of the method of FIGS. 1A, 1B, 1C, and/or 1D according to aspects of the present disclosure.
Figure 7D:
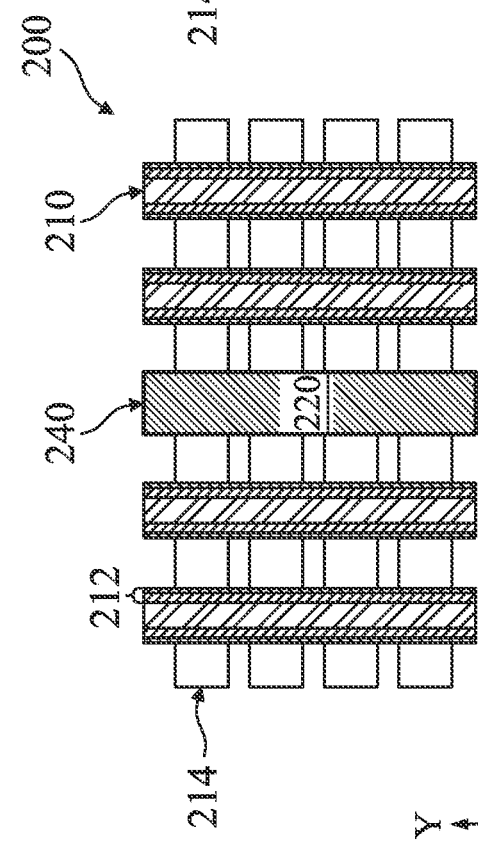
FIG. 7D is a cross-sectional view taken along line C-C' of the semiconductor structure of FIGS. 2A, 2B, and/or 7B implemented with an embodiment of the method of FIGS. 1A, 1B, 1C, and/or 1D according to aspects of the present disclosure.

Thereafter, referring to FIG. 7B, the method 160 performs a planarization process (e.g., a CMP process) to the device 200 similar to operation 144 as discussed above. Accordingly, the planar top view (FIG. 7C) of the device 200 shows the dielectric feature 240 including the dielectric layer 220, while the cross-sectional view (FIG. 7D) of the device 200 taken along the line C-C' of FIG. 2A shows the dielectric feature 240 including the air gap 228 embedded in or surrounded by the dielectric layer 220.

In some embodiments, the order in which the metal gate replacement process (i.e., operation 164) and the CPODE formation process (i.e., operation 166) may be reversed, such that the method 160 first replaces a dummy gate stack 206 with the dielectric features 240 before replacing an adjacent dummy gate stack 206 with an HKMG structure 210. In some examples, referring to FIGS. 8A and 8B, the methods 100 and 160 may be implemented in the same device, i.e., the dielectric feature 230 is configured to separate HKMG structures 210 as well as the dielectric feature 240, which is oriented lengthwise in a direction generally parallel to the HKMG structures 210. As a result, the dielectric features 230 and 240 are configured to intersect each other. Specifically, the dielectric layer 226 may be revealed in a planar top view (FIG. 8A), consistent with the embodiments depicted in FIGS. 3H and 6L, and the dielectric layer 222 embedded in the dielectric layer 220 may be shown in a cross-sectional view (FIG. 8B) taken along the line C-C' of FIG. 2A, consistent with the embodiments depicted in FIGS. 3I and 6M.

Although not intended to be limiting, one or more embodiments of the present disclosure provide many benefits to a semiconductor device and the formation thereof. The present disclosure provides dielectric features for isolating HKMG structures and for adjusting pitch between active regions that include HKMG structures. In some embodiments, the dielectric features are configured to include a two-layer structure with an inner layer embedded in an outer layer, which has a higher dielectric constant than the inner layer. In some examples, the inner layer may by a void, i.e., an air gap. In some embodiments, the dielectric features are configured to include a three-layer structure with an inner layer embedded in two outer layers each having a higher dielectric constant than the inner layer. Notably, the multi-layer structures as provided herein may present advantages in reducing the overall effective capacitance of the dielectric features, thereby improving device performance with respect parameters such as RC delay.

In one aspect, the present disclosure provides a semiconductor structure that includes a fin protruding from a substrate, a first and a second metal gate stacks disposed over the fin, and a dielectric feature defining a sidewall of each of the first and the second metal gate stacks. Furthermore, the dielectric feature includes a two-layer structure, where sidewalls of the first layer are defined by the second layer, and where the first and the second layers have different compositions.

In another aspect, the present disclosure provides a semiconductor structure that includes a semiconductor layer disposed over a substrate and oriented in a first direction, a metal gate stack disposed over the semiconductor layer and oriented in a second direction generally perpendicular to the first direction, a source/drain feature disposed in the semiconductor layer and adjacent to the metal gate stack, and a dielectric feature extending into the semiconductor layer. Furthermore, the source/drain feature is disposed between the metal gate stack and the dielectric feature, which includes a first layer enclosed by a second layer, where the dielectric constant of the first layer is different from the dielectric constant of the second layer.

In yet another aspect, the present disclosure provides a method of fabricating a semiconductor device that includes first forming a high-k metal gate stack (HKMG) over a semiconductor layer, and subsequently forming a trench to separate the HKMG into two portions. The method further includes forming a first dielectric layer in the trench and forming a second dielectric layer over the first dielectric layer to fill the trench, where the first and the second dielectric layers have different compositions. The method further includes removing a portion of the second dielectric layer to form a recess, and subsequently forming a third dielectric layer in the recess, where the third dielectric layer is different from the second dielectric layer. Thereafter, the method proceeds to planarizing the third dielectric layer to complete formation of a gate isolation feature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a fin protruding from a semiconductor substrate;
a first metal gate stack (MG) and a second MG disposed over the fin; and
a dielectric feature disposed over the semiconductor substrate and across both the first and the second MGs, wherein the dielectric feature extends lengthwise parallel to the fin, wherein the dielectric feature includes a first layer disposed on a second layer, wherein sidewalls of the first layer are defined by the second layer, and wherein the first layer is different from the second layer in composition.

2. The semiconductor structure of claim 1, wherein dielectric constant of the first layer is less than dielectric constant of the second layer.

3. The semiconductor structure of claim 1, wherein porosity of the first layer is greater than porosity of the second layer.

4. The semiconductor structure of claim 1, wherein the first layer includes air.

5. The semiconductor structure of claim 1, wherein the dielectric feature further includes a third layer disposed on the first layer, and wherein sidewalls of the third layer are defined by the second layer.

6. The semiconductor structure of claim 5, wherein composition of the second layer is the same as composition of the third layer.

7. The semiconductor structure of claim 5, wherein composition of the second layer is different from composition of the third layer.

8. The semiconductor structure of claim 1, wherein the dielectric feature extends to below a top surface of the semiconductor substrate.

9. A semiconductor structure, comprising:
a semiconductor layer disposed over a substrate and oriented along a first direction;
a metal gate stack disposed over the semiconductor layer and oriented along a second direction generally perpendicular to the first direction;
a first dielectric feature oriented along the first direction and penetrating the substrate; and
a second dielectric feature extending into the semiconductor layer and oriented along the second direction, wherein the second dielectric feature intersects with the first dielectric feature, wherein the second dielectric feature includes a first layer enclosed by a second layer, and wherein dielectric constant of the first layer is different from dielectric constant of the second layer.

10. The semiconductor structure of claim 9, wherein the dielectric constant of the first layer is lower than the dielectric constant of the second layer.

11. The semiconductor structure of claim 9, wherein the first layer includes air.

12. The semiconductor structure of claim 9, further comprising first gate spacers disposed on sidewalls of the metal gate stack and second gate spacers disposed on the first gate spacers, wherein portions of the second dielectric feature are defined by the second gate spacers.

13. The semiconductor structure of claim 9, wherein the first dielectric feature separates each of the metal gate stack and the first dielectric feature into two portions, and wherein the first dielectric feature includes the first layer embedded in the second layer.

14. The semiconductor structure of claim 9, wherein the second dielectric feature further includes a third layer disposed over the first layer, and wherein the third layer is in direct contact with the second layer.

15. A semiconductor structure, comprising:
a fin protruding from a semiconductor substrate and oriented along a first direction;
a metal gate stack (MG) over the fin and oriented along a second direction perpendicular to the first direction; and
a dielectric feature disposed adjacent to the fin and oriented along the first direction, wherein the dielectric feature extends through the MG to penetrate the semiconductor substrate, thereby separating the MG into a first portion and a second portion, wherein the dielectric feature includes a first dielectric layer disposed on a second dielectric layer, wherein sidewalls of the first dielectric layer are defined by the second dielectric layer, and wherein the first dielectric layer is different from the second dielectric layer in composition.

16. The semiconductor structure of claim 15, wherein porosity of the first dielectric layer is greater than porosity of the second dielectric layer.

17. The semiconductor structure of claim 15, wherein the dielectric feature further includes a third dielectric layer disposed on the first dielectric layer, and wherein sidewalls of the third dielectric layer are defined by the second dielectric layer.

18. The semiconductor structure of claim 17, wherein composition of the second dielectric layer is the same as composition of the third dielectric layer.

19. The semiconductor structure of claim 17, wherein composition of the second dielectric layer is different from composition of the third dielectric layer.

20. The semiconductor structure of claim 15, wherein the first dielectric layer includes air.

* * * * *